ELECTRIC FIELD CONTROLLED SEMICONDUCTOR DEVICE

Filed May 31, 1960

INVENTOR
D. KAHNG
BY H. W. Lockhart
ATTORNEY

United States Patent Office 3,102,230

Patented Aug. 27, 1963

3,102,230

ELECTRIC FIELD CONTROLLED SEMICONDUCTOR DEVICE

Dawon Kahng, Plainfield, N.J., assignor to Bell Telephone Laboratories, Incorporated, New York, N.Y., a corporation of New York Filed May 31, 1960, Ser. No. 32,801
6 Claims. (Cl. 323—94)

This invention relates to circuit arrangements including dielectric coated semiconductor devices.

More particularly, the present invention relates to circuit arrangements utilizing a semiconductive device which comprises either a p-n-p or n-p-n wafer having a dielectric film over a portion of the middle zone. Such a device is disclosed in application Serial No. 13,688 of M. M. Atalla, filed March 8, 1960.

In accordance with the present invention useful characteristics are obtained from a device of this type by arranging the associated circuitry to vary an electric field across the oxide in response to variations in voltage across the junctions. In particular, voltage regulation or amplification can be achieved by the invention.

Therefore, a feature of this invention is a novel circuit arrangement which provides across the dielectric layer of the above device an electric field which varies in response to variations in voltage across the p-n junctions.

The invention in its preferred form comprises a semiconductor wafer, typically silicon, including first, second and third regions defining respectively first and second p-n junctions which intersect a major surface of the wafer. This major surface of the wafer is coated with a suitable dielectric, typically a thermally grown silicon dioxide coating for a silicon wafer, and an electrode is connected to the surface of this oxide coating so as to extend beyond the line of intersection with the surface of the two p-n junctions. A first bias voltage is applied between ohmic contacts to the first and third regions poled to forward bias the first p-n junction and to reverse bias the second. A second bias voltage is applied between the electrode to the oxide coating and the contact to the third region. The electric field across the oxide coating is the result of this second bias and varies in response to variations in the voltage between the two substantially ohmic contacts.

The invention and its objects and features will become apparent during the course of the following detailed description which is rendered with reference to the accompanying drawing in which.

It is to be understood that the figures are illustrative only and, therefore, not necessarily to scale.

Figure 1A:
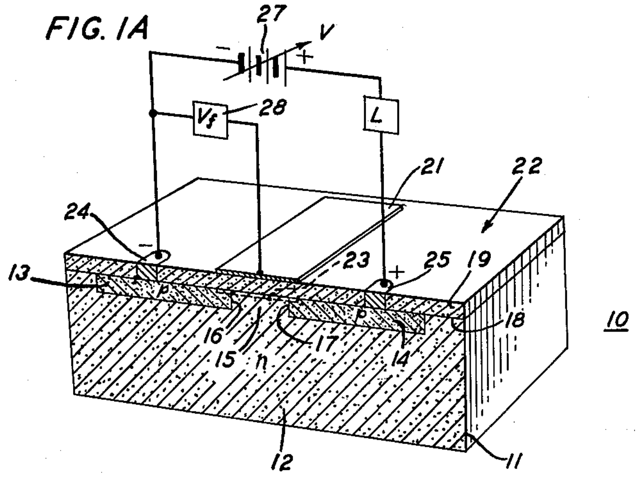
FIG. 1A is a perspective view partially in cross section of the preferred embodiment of this invention.

Referring now to FIG. 1A in detail, device 10 comprises a semiconductor wafer 11, typically monocrystalline silicon, having dimensions of approximately .060 inch square by .010 inch thick. The bulk portion 12 of wafer 11 is of n-type conductivity with spaced p-type surface portions 13 and 14 adjacent a major surface 18 of the wafer. Surface portions 13 and 14 are about .001 inch deep and are formed by well-known vapor-solid diffusion and photo-resist techniques. The portion 15 between the two surface portions 13 and 14 is approximately .003 inch wide and bounded by p-n junctions 16 and 17, respectively. Advantageously, the surface area of portions 13 and 14 is restricted to avoid excessive capacitance. In this specific example, each surface portion has a "key hole" appearance having extreme surface dimensions of less than .025 inch square but occupying a surface area of less than $3\times10^{-4}$ (inch)$^2$. The oxide coating 19 is in intimate contact with surface 18 of the wafer. The oxide is about 1000 angstrom units thick and thermally grown in accordance with the processes described in United States Patent No. 2,930,722, issued March 29, 1960 to J. R. Ligenza. These processes leave oxide coatings over the entire device. The oxide can be restricted to selected portions of the surface of the device, if so desired, by well-known masking or lapping techniques. The oxide is shown restricted in the figure primarily for clarity. An electrode 21 is deposited over the exposed surface 22 of the oxide coating 19 to extend over the region of intersection of both p-n junctions 16 and 17. Ohmic contacts 24 and 25 are affixed to surface portions 13 and 14, respectively. A load L and a battery 27 of voltage V are connected serially between contacts 24 and 25. The battery is poled to reverse bias p-n junction 16 and forward bias p-n junction 17. A voltage source 28 providing a voltage $V_f$ is connected between electrode 21 and contact 24. In response to an accumulation of charge of one polarity on the electrode 21, a charge of opposite polarity is induced in the surface portion 23 of wafer 11.

Figure 2:
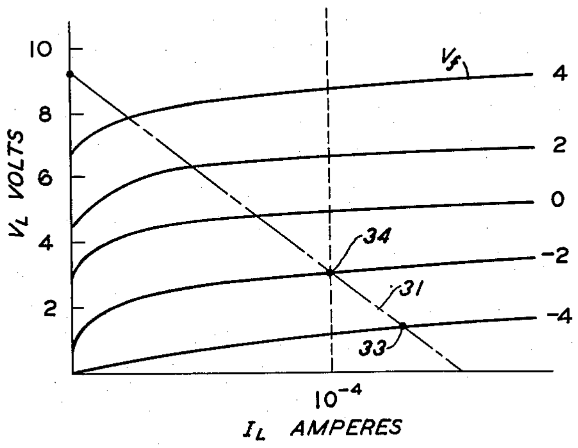
FIG. 2 is a graph depicting the current-voltage characteristics of the embodiment of FIG. 1A.

A typical load line drawn for the load L is shown by the broken line 31 in the graph of FIG. 2. First, it can be seen from the graph that each of the characteristics corresponding to a fixed value of $V_f$ exhibits a horizontal portion where the voltage is relatively insensitive to the current. Accordingly, the device described is useful as a voltage regulator when operated with a constant value of $V_f$. Moreover, it can be seen that adjustment to a particular fixed value of $V_f$ permits control of the voltage at which regulation occurs. Accordingly, the invention in this aspect is a voltage regulator whose voltage level can be varied simply by variation of the steady voltage between electrode 21 and contact 24.

Figure 1B:
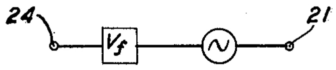
FIG. 1B is an alternative circuit arrangement for the embodiment of FIG. 1A.

As an alternative mode of operation, a signal source can be inserted serially with the source of D.-C. voltage $V_f$. This arrangement is shown schematically in FIG. 1B. In this mode, changes in the voltage of the signal source will cause corresponding changes, although with a phase reversal, in the voltage across the load L. Because the input impedance typically is much higher than the load impedance, power amplification is possible.

While the specific embodiments are disclosed in terms of silicon and silincon dioxide, such choices are merely by way of example. The choice of semiconductor material and corresponding dielectric appear to be limited only by the availablity of techniques for depositing the dielectric. There are, however, well-known considerations important in selecting the semiconductor material and a suitable dielectric. The main consideration is to produce the highest field E in the semiconductor material with the smallest input voltage $V_f$. The equation relating E and V is $$E=\frac{e_f}{e_s}\cdot\frac{V}{t},$$

where $e_f$ is the dielectric constant of the dielectric coating, $e_s$ is the dielectric constant of the semiconductor material and $t$ is the thickness of the dielectric coating. To obtain the highest field for the lowest input voltage, $$\frac{e_f}{t}$$

is maximized. $e_f$ for silicon dioxide is 3.8. A typical thickness $t$ for the oxide coating is 1000 angstrom units or $10^{-5}$ centimeters. Therefore, a figure of merit is $$\frac{3.8}{10^{-5}\text{ cms.}}$$

or $3.8\times10^5$ [cms. $^{-1}$]. As a comparison, the dielectric constant for titanium oxide is 100. Therefore, a correspondingly suitable titanium oxide coating would have to be $$\frac{100}{3.8\times10^5}$$

or 26,300 angstrom units thick. The ease of growing a 1000 angstrom unit silicon dioxide layer on silicon as compared to the difficulties in depositing a titanium oxide layer of over 26,000 angstrom units suggested the present advantage of the silicon system. It is expected also that the thin film found on such compound semiconductors as n-type gallium arsenide is adaptable for use in accordance with this invention.

Furthermore, the highest operating voltage V for a particular device is determined by the equation $$E_{st}\geqq\frac{V-V_f}{t}$$

where $E_{st}$ is the dielectric strength of the dielectric coating.

A device of the kind useful in this invention was fabricated starting with a silicon wafer including a uniform concentration of phosphorous and having a resistivity of about 6 ohm centimeters. A silicon dioxide coating was grown over the surface of the wafer by heating the wafer in a water vapor atmosphere for 120 minutes at a temperature of 1200 degrees centigrade. Photo-resist techniques were used to expose two suitably shaped portions of the underlying semi-conductor surface through the oxide and the wafer was exposed to a boron pentoxide vapor. By the closed box diffusion technique disclosed in copending application No. 740,958 of B. T. Howard, filed June 9, 1958, now issued as Patent No. 3,066,052, dated November 27, 1962, a surface concentration of about $$10^{20}\ \frac{\text{atoms}}{\text{cc.}}$$

of boron was obtained at such exposed portions. This diffusion provided two surface portions of p-type conductivity each having a keyhole shape and separated by an n surface region of .0018 inch by .025 inch. Advantageously, the length of this n-type surface region, divided by its width, is maximized for optimum transconductance. The residual oxide was removed in concentrated hydrofluoric acid. This acid, in about five to ten minutes, provides a coating over the p-type surface portions, which is used often to determine the position of the p-n junctions in silicon. Here, however, the coating is employed to mask the p region in a subsequent etching step wherein the wafer is washed in a 10 to 1 solution of nitric and hydrofluoric acids for twenty to thirty seconds. About .0012 inch of silicon is etched from the unmasked portions of the surface of the wafer. The advantage of this technique is that the initial surface impurity concentration of the p-type surface is maintained by protecting this surface during the etching step, facilitating the application of ohmic contacts. The wafer then was cleaned, and oxidized in steam in accordance with the teaching of the U.S. Patent 2,930,722 to J. R. Ligenza. A 1000 angstrom unit coating of oxide was formed by heating the wafer at about 650 degrees centigrade for forty minutes at a pressure of 55 atmospheres. An aluminum electrode of about 1500 angstroms was evaporated onto the oxide coating opposite the two p-n junctions and the n-type channel. Two holes were drilled through the oxide to the p-type surface portions of the wafer and a gold lead was bonded to the exposed portions in a manner well known in the art. The frequency cut-off for the device was over $10^8$ cycles per second and the maximum voltage applied across the junctions for $V_f=5$ volts was 105 volts.

No effort has been made to exhaust the possible embodiments of the invention. It will be understood that the embodiment described is merely illustrative of the preferred form of the invention and various modifications may be made therein without departing from the scope and spirit of this invention.

What is claimed is:

1. In combination, a semiconductor wafer including at least a first and third region of one conductivity type separated by a second region of the opposite conductivity type and defining respectively a first and second p-n junction, said first and second p-n junctions intersecting a major surface of the wafer, a dielectric coating over at least said major surface, means for impressing a voltage across said first and second p-n junctions, means for impressing an electric field across said dielectric in a direction to encompass both said dielectric and said semiconductor wafer, said electric field being particularly characterized in that it is responsive to variations in the voltage across said first and second p-n junctions.

2. In combination, a silicon semiconductor wafer including at least a first and third conductivity-type region of one conductivity type separated by a second region of the opposite conductivity type and defining respectively a first and second p-n junction intersecting a major surface of the wafer, a silicon dioxide coating grown over at least said major surface, means for impressing a voltage across said first and second p-n junctions, means for impressing an electric field across said silicon dioxide coating in a direction to encompass both said dielectric and at least said second region of opposite conductivity type, said electric field being particularly characterized in that it is responsive to variations in the voltage across said first and second p-n junctions.

3. In combination, a semiconductor wafer including first, second and third conductivity-type regions defining respectively first and second p-n junctions which intersect a major surface of the wafer, a dielectric coating on at least said major surface, a substantially ohmic contact to each of said first and third conductivity regions, an electrode to said dielectric coating, said electrode extending along the surface of said dielectric opposite said second conductivity-type region and said first and second p-n junctions, a load and a first biasing means between the substantially ohmic contacts to said first and third regions, said first biasing means poled to forward bias said first p-n junction and reverse bias said second p-n junction, and a second biasing means connected between said electrode and the contact to said third region.

4. In combination, a silicon wafer including first, second and third conductivity-type regions defining respectively first and second p-n junctions which intersect a major surface of the wafer, an oxide coating on at least said major surface, a substantially ohmic contact to each of said first and third conductivity regions, an electrode to said oxide coating, said electrode extending along the surface of said oxide opposite said second conductivity-type region and said first and second p-n junctions, a load and a first biasing means between the substantially ohmic contacts to said first and third regions, said first biasing means poled to forward bias said first p-n junction and reverse bias said second p-n junction, and a second biasing means connected between said electrode and the contact to said third region.

5. In combination, a silicon wafer comprising a major portion of a first conductivity type and including adjacent a major surface thereof a first and second surface portion of the opposite conductivity type, the interface between said first and second surface portions and the region of said first conductivity type defining a first and second p-n junction, respectively, a silicon dioxide coating grown on said major surface, a substantially ohmic contact to each of said first and second surface portions, an electrode to said silicon dioxide coating opposite said first and second p-n junctions, a load and a first biasing means between the contacts to said first and second surface portions, said first biasing means poled to forward bias said first p-n junction and reverse bias said second p-n junction, and a second biasing means and a signal generator connected between said electrode and the contact to said second surface portion.

6. In combination, a silicon wafer of a first conductivity type including adjacent a major surface thereof a first and second surface portion of the opposite conductivity type, the interface between said first and second surface portions and the major portion of a first conductivity type defining a first and second p-n junction, respectively, said first and second surface portions extending inwardly about .001 inch, said first and second p-n junctions being separated by about .003 inch or less, a silicon dioxide coating grown in said major surface, a substantially ohmic contact to each of said first and second surface portions, an electrode to said silicon dioxide coating opposite said first and second p-n junctions, a load and a first biasing means between the contacts to said first and second surface portions, said first biasing means poled to forward bias said first p-n junction and reverse bias said second p-n junction, and a second biasing means and a signal generator connected between said electrode and the contact to said second surface portion.

References Cited in the file of this patent

UNITED STATES PATENTS 2,918,628 Stuetzer ---------------- Dec. 22, 1959